(12) United States Patent
Sheu et al.

(10) Patent No.: US 10,756,079 B2
(45) Date of Patent: Aug. 25, 2020

(54) METHODS FOR FORMING INTEGRATED CIRCUIT HAVING GUARD RINGS

(71) Applicant: TAIWAN SEMICONDUCTOR MANUFACTURING COMPANY, LTD., Hsinchu (TW)

(72) Inventors: Ming-Song Sheu, Hsinchu (TW); Jian-Hsing Lee, Hsinchu (TW); Yu-Chang Jong, Hsinchu (TW); Chun-Chien Tsai, Yongkang (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/670,649

(22) Filed: Aug. 7, 2017

(65) Prior Publication Data

US 2017/0338218 A1    Nov. 23, 2017

Related U.S. Application Data

(60) Division of application No. 14/312,851, filed on Jun. 24, 2014, now Pat. No. 9,748,361, which is a continuation of application No. 13/689,187, filed on Nov. 29, 2012, now Pat. No. 8,772,092, which is a division of application No. 12/777,672, filed on May 11, 2010, now Pat. No. 8,344,416.

(60) Provisional application No. 61/178,613, filed on May 15, 2009.

(51) Int. Cl.
*H01L 29/02* (2006.01)
*H01L 27/02* (2006.01)
*H01L 29/10* (2006.01)
*H01L 29/78* (2006.01)
*H01L 29/06* (2006.01)
*H01L 29/66* (2006.01)

(52) U.S. Cl.
CPC ...... *H01L 27/0251* (2013.01); *H01L 29/0619* (2013.01); *H01L 29/0623* (2013.01); *H01L 29/1083* (2013.01); *H01L 29/66681* (2013.01); *H01L 29/7817* (2013.01); *H01L 29/7835* (2013.01); *H01L 29/0653* (2013.01); *H01L 29/0692* (2013.01); *H01L 29/1045* (2013.01)

(58) Field of Classification Search
None
See application file for complete search history.

(56) References Cited

U.S. PATENT DOCUMENTS

| | | | |
|---|---|---|---|
| 6,323,074 B1 | 11/2001 | Jiang et al. | |
| 8,344,416 B2 | 1/2013 | Sheu et al. | |
| 8,772,092 B2 * | 7/2014 | Sheu | H01L 27/0251 438/140 |
| 2005/0073007 A1 * | 4/2005 | Chen | H01L 29/1083 257/355 |
| 2005/0082618 A1 | 4/2005 | Wu et al. | |

(Continued)

*Primary Examiner* — Daniel Whalen
(74) *Attorney, Agent, or Firm* — Hauptman Ham, LLP (57) ABSTRACT

A method for forming an integrated circuit includes forming a first guard ring around at least one transistor over a substrate. The method further includes forming a second guard ring around the first guard ring. The method further includes forming a first doped region adjacent to the first guard ring, the first doped region having a first dopant type. The method further includes forming a second doped region adjacent to the second guard ring, the second doped region having a second dopant type.

14 Claims, 6 Drawing Sheets

(56) References Cited

U.S. PATENT DOCUMENTS

2008/0073721 A1 3/2008 Fuchigami
2009/0101937 A1 4/2009 Lee et al.
2010/0109081 A1* 5/2010 Chen ............... H01L 21/823857
　　　　　　　　　　　　　　　　　　　　257/336

* cited by examiner

METHODS FOR FORMING INTEGRATED CIRCUIT HAVING GUARD RINGS

PRIORITY CLAIM

The present application is a divisional of U.S. application Ser. No. 14/312,851, filed Jun. 24, 2014, which is a continuation of U.S. application Ser. No. 13/689,187, filed Nov. 29, 2012, now U.S. Pat. No. 8,772,092, issued Jul. 8, 2014, which is a divisional of U.S. application Ser. No. 12/777,672, filed May 11, 2010, now U.S. Pat. No. 8,344,416, issued Jan. 1, 2013, which claims the priority of U.S. Provisional Application No. 61/178,613 filed May 15, 2009, all of which are incorporated herein by reference in their entireties.

TECHNICAL FIELD

The present disclosure relates generally to the field of semiconductor circuits, and more particularly, to integrated circuits using guard rings for electrostatic discharge (ESD) systems, and methods for forming the integrated circuits.

BACKGROUND

The semiconductor integrated circuit (IC) industry has experienced rapid growth. Technological advances in IC materials and design have produced generations of ICs where each generation has smaller and more complex circuits than the previous generation. The scaling of IC techniques to nanometer regime has increased power dissipation. The increased power dissipation causes several problems including reducing battery life in mobile systems, expensive packaging and cooling solutions and can also result in chip failures. Of the various components contributing to power dissipation, leakage or static power dissipation is growing very fast and is predicted to exceed dynamic power dissipation in the near future.

In another aspect, various devices have been proposed for providing special functions. For example, diffused metal-gate-oxide semiconductor (DMOS) transistors have been proposed for high voltage operations. To integrate the DMOS transistors with conventional bipolar-CMOS transistors, a process named bipolar-CMOS-DMOS (BCD) process has been developed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

The conventional DMOS transistor includes a laterally diffused drain that can desirably prevent oxide damage due to a high voltage drop applied between the drain and gate of the conventional DMOS transistor. It is found that if an electrostatic discharge (ESD) occurs at the drain of the conventional DMOS transistor, the conventional DMOS transistor itself cannot survive and release the ESD. The conventional DMOS transistor may be damaged.

To avoid the ESD situation, a p+ doped region has been proposed to be formed within the drain of the conventional DMOS transistor. The p+ doped region, n-type well, p-type well, and the source of the conventional DMOS transistor can constitute a silicon controlled rectifier (SCR). The SCR can release the ESD occurring at the drain of the DMOS transistor to the ground.

Based on the foregoing, integrated circuits that are capable of substantially releasing an ESD, systems, and methods for forming the integrated circuits are desired.

It is understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Figure 1:
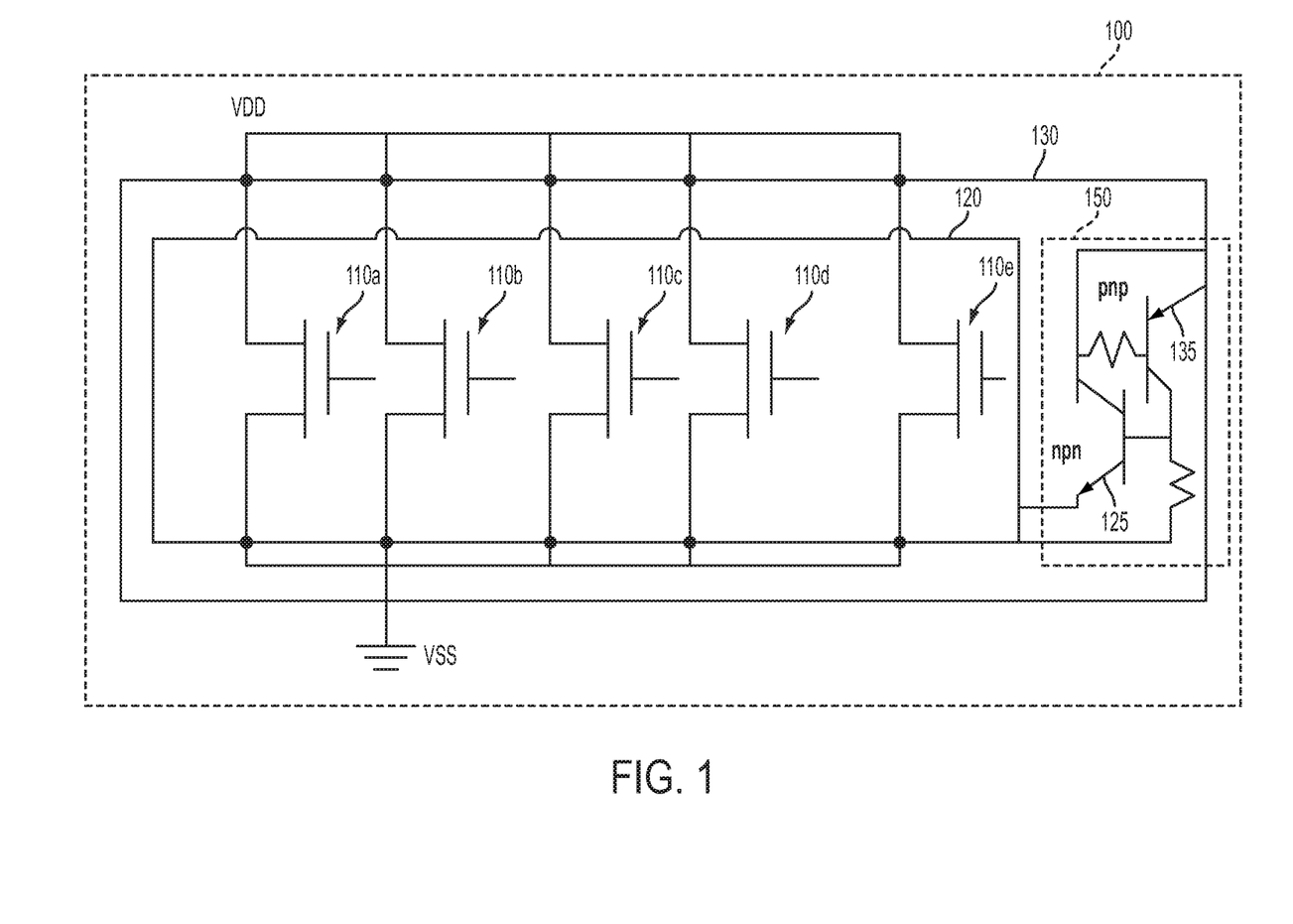
FIG. 1 is a schematic drawing showing an exemplary integrated circuit including guard rings disposed around transistors.

FIG. 1 is a schematic drawing showing an exemplary integrated circuit including guard rings disposed around transistors. In FIG. 1, an integrated circuit 100 can include at least one transistor, e.g., transistors 110a-110e. The integrated circuit 100 can include a power switching circuit, a liquid crystal display (LCD) driver, and/or other integrated circuit that is capable of functioning at a high operating voltage.

Drains of the transistors 110a-110e can be coupled with a voltage source, e.g., VDD, and sources of the transistors 110a-110e can be coupled with another voltage source, e.g., VSS or ground. The transistors 110a-110e can be diffused metal-gate-oxide (DMOS) transistors or transistors that are capable of being operable at an operating voltage of about 26 V or more. In various embodiments, the operating voltage can be around 40 V, 60 V, or more.

The integrated circuit 100 can include a first guard ring, e.g., guard ring 120, and a second guard ring, e.g., guard ring 130. The guard ring 120 can be disposed around the transistors 110a-110e. The guard ring 130 can be disposed around the guard ring 120. A first doped region, e.g., a doped region 125, can be disposed adjacent to the guard ring 120. A second doped region, e.g., doped region 135, can be disposed adjacent to the guard ring 130.

The guard ring 120 can have a first type dopant, e.g., p-type dopant. The guard ring 130 can have a second type dopant, e.g., n-type dopant. The doped region 125 can have the second type dopant, e.g., n-type dopant. The doped region 135 can have the first type dopant, e.g., p-type dopant. The guard ring 120 can be coupled with the sources of the transistors 110a-110e. The guard ring 130 can be coupled with the drains of the transistors 110a-110e. The guard rings 120 and 130 can be configured to substantially electrically insulate the transistors 110a-110e from other transistors, devices, diodes, and/or circuits outside the guard rings 120 and 130.

The guard rings 120, 130 and the doped regions 125, 135 can be operable as a silicon controlled rectifier (SCR) 150 to substantially release an electrostatic discharge (ESD). For example, if an ESD occurs at the drains of the transistors 110a-110e, the ESD can be substantially released through the SCR 150 to the power source VSS. As noted, the transistors 110a-110e can be operable at the high operating voltage, e.g., 40 V, 60 V, or more. In various embodiments, the SCR 150 of the integrated circuit 100 can meet a human body model (HBM) of an automobile specification. The HBM can be around 8 KV or more.

Figure 2A:
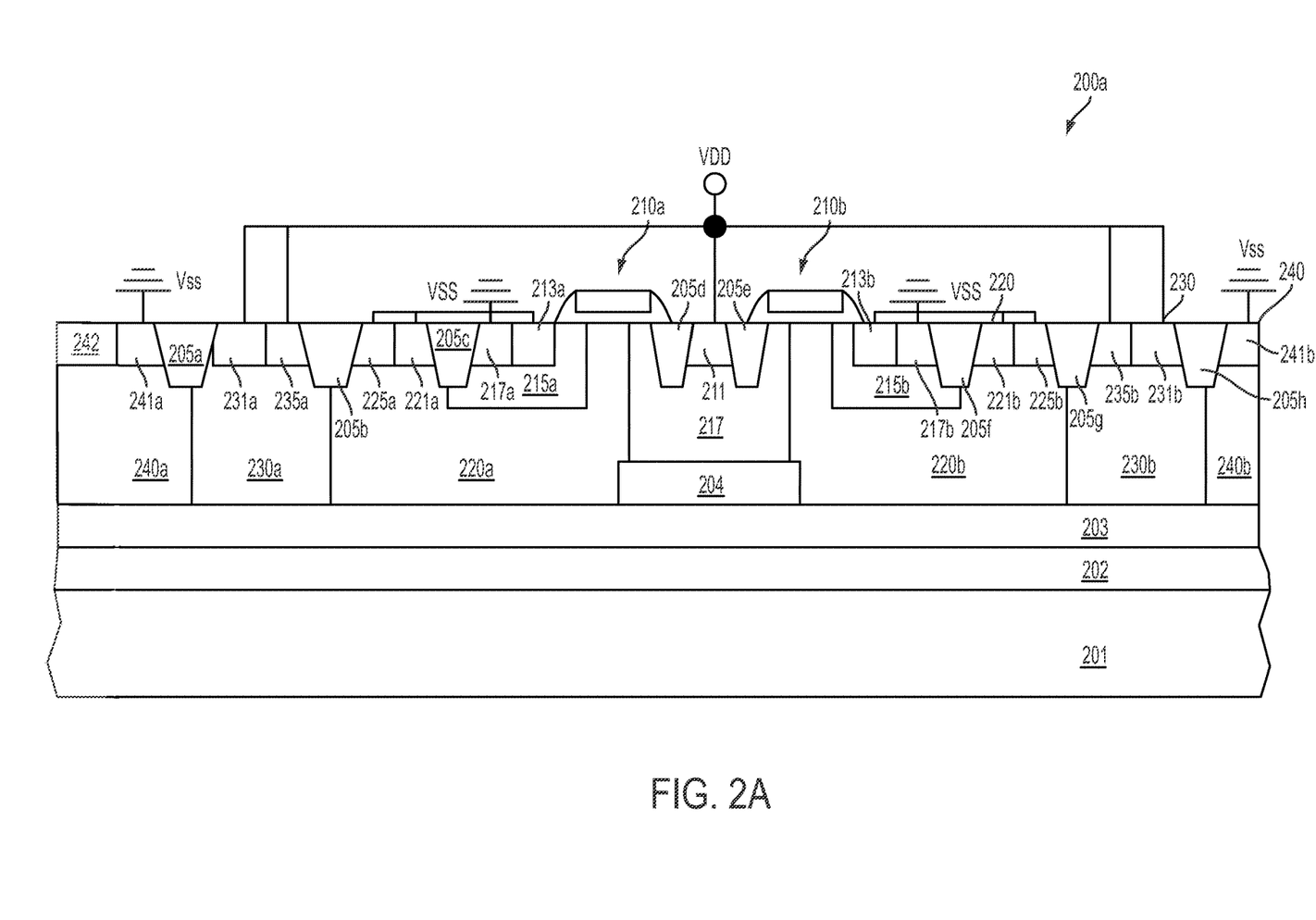
FIG. 2A is a schematic cross-sectional view of an exemplary integrated circuit including guard rings and transistors.

FIG. 2A is a schematic cross-sectional view of an exemplary integrated circuit including guard rings and transistors. In FIG. 2A, an integrated circuit 200a can be similar to the integrated circuit 100. The integrated circuit 200a can include transistors 210a and 210b, each of which is similar to one of the transistors 110a-110e shown in FIG. 1.

In FIG. 2A, the transistors 210a and 210b can be formed over a substrate 201. In various embodiments, the substrate 201 can include an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In one embodiment, the alloy semiconductor substrate may have a gradient SiGe feature in which the Si and Ge composition changes from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the substrate may include a multilayer compound semiconductor structure.

In various embodiments, an epi-layer 202, e.g., a p-type epi-layer, can be formed over the substrate 201. An n-type buried layer (NBL) 203 can be formed over the epi-layer 202. A deep well 204, e.g., a deep p-type well (DPW), can be formed over the NBL 203. A well 217, e.g., a high-voltage n-type well (HVNW), can be formed over the deep well 204. Isolation structures 205a-205h, e.g., field oxide layers or shallow trench isolation (STI) structures, can be disposed between guard rings and between sources and drains of the transistors 210a and 210b. In various embodiments, the wells and layers described above are configured for the high-voltage operation of the transistors 210a and 210b. One of skill in the art can add more or remove the wells and/or the layers to achieve a desired integrated circuit for the high-voltage operation.

Referring again to FIG. 2A, drains 211 of the transistors 210a and 210b can be coupled with a power source, e.g., VDD. Sources 213a and 213b of the transistors 210a and 210b, respectively, can be coupled with a power source, e.g., VSS or ground. Doped regions 215a and 215b, e.g., p-type doped regions, can be formed around the sources 213a and 213b, respectively. The doped regions 215a and 215b can be operable to provide channels for the transistors 210a and 210b, respectively. In various embodiments, the doped regions 215a and 215b can be referred to as p-type body regions. Doped regions 217a and 217b can be disposed adjacent to the sources 213a and 213b, respectively, and coupled with the power source VSS.

The integrated circuit 200a can include a guard ring 220, e.g., a p-type guard ring, including p-type wells 220a, 220b and p+ doped regions 221a, 221b. In various embodiments, the p+ doped regions 221a and 221b can be referred to as pickup regions for the p-type wells 220a and 220b, respectively. A guard ring 230, e.g., an n-type guard ring, can be disposed around the guard ring 220. The guard ring 230 can include n-type wells 230a, 230b and n+ doped regions 231a, 231b. In various embodiments, the n+ doped regions 231a and 231b can be referred to as pickup regions for the n-type wells 230a and 230b, respectively.

Referring to FIG. 2A, the integrated circuit 200a can include doped regions 225a and 225b, e.g., n+ doped regions, disposed adjacent to the p+ doped regions 221a and 221b, respectively. In various embodiments, the doped regions 225a and 225b can be coupled with the power source VSS. Doped regions 235a and 235b, e.g., p+ doped regions, can be disposed adjacent to the n+ doped regions 231a and 231b, respectively. The doped regions 235a and 235b can be coupled with the power source VDD. In various embodiments, the doped regions 225a and 225b can be spaced from the drains 211 by the guard ring 220. In other various embodiments, the doped regions 225a and 225b can be spaced from the doped regions 235a and 235b by the isolation structure 205b and 205g, respectively. The isolation structure 205b and 205g can insulate the doped regions 225a and 225b from the doped regions 235a and 235b.

It is found that the doped region 225a, the p-type well 220a, and the n-type well 230a can serve as an npn transistor. The doped region 235a, the n-type well 230a, and the p-type well 220a can serve as a pnp transistor. The npn and pnp transistors can be operable as an SCR. If an ESD occurs at the drains 211 of the transistors 210a and 210b, the SCR including the npn and pnp transistors can be triggered to substantially release the ESD to the power source VSS.

In various embodiments, the integrated circuit 200a can include a guard ring 240, e.g., a p-type guard ring, including p-type wells 240a, 240b and p+ doped regions 241a, 241b. In various embodiments, the p+ doped regions 241a and 241b can be referred to as pickup regions for the p-type wells 240a and 240b, respectively. The integrated circuit 200a can include doped regions 242, e.g., n+ doped regions, disposed adjacent to the p+ doped regions 241a and 241b. In various embodiments, the doped regions 242 adjacent to the p+ doped regions 241a and 241b can be coupled with the power source VSS. It is found that the doped region 242 adjacent to the p+ doped region 241a, the p-type well 240a, and the n-type well 230a can form an npn transistor. The doped region 235a, the n-type well 230a, and the p-type well 240a can form a pnp transistor. The npn and pnp transistors can be operable as another SCR. If an ESD occurs at the drains 211 of the transistors 210a and 210b, the SCR including the npn and pnp transistors can be triggered to release the ESD to the power source VSS.

Figure 2B:
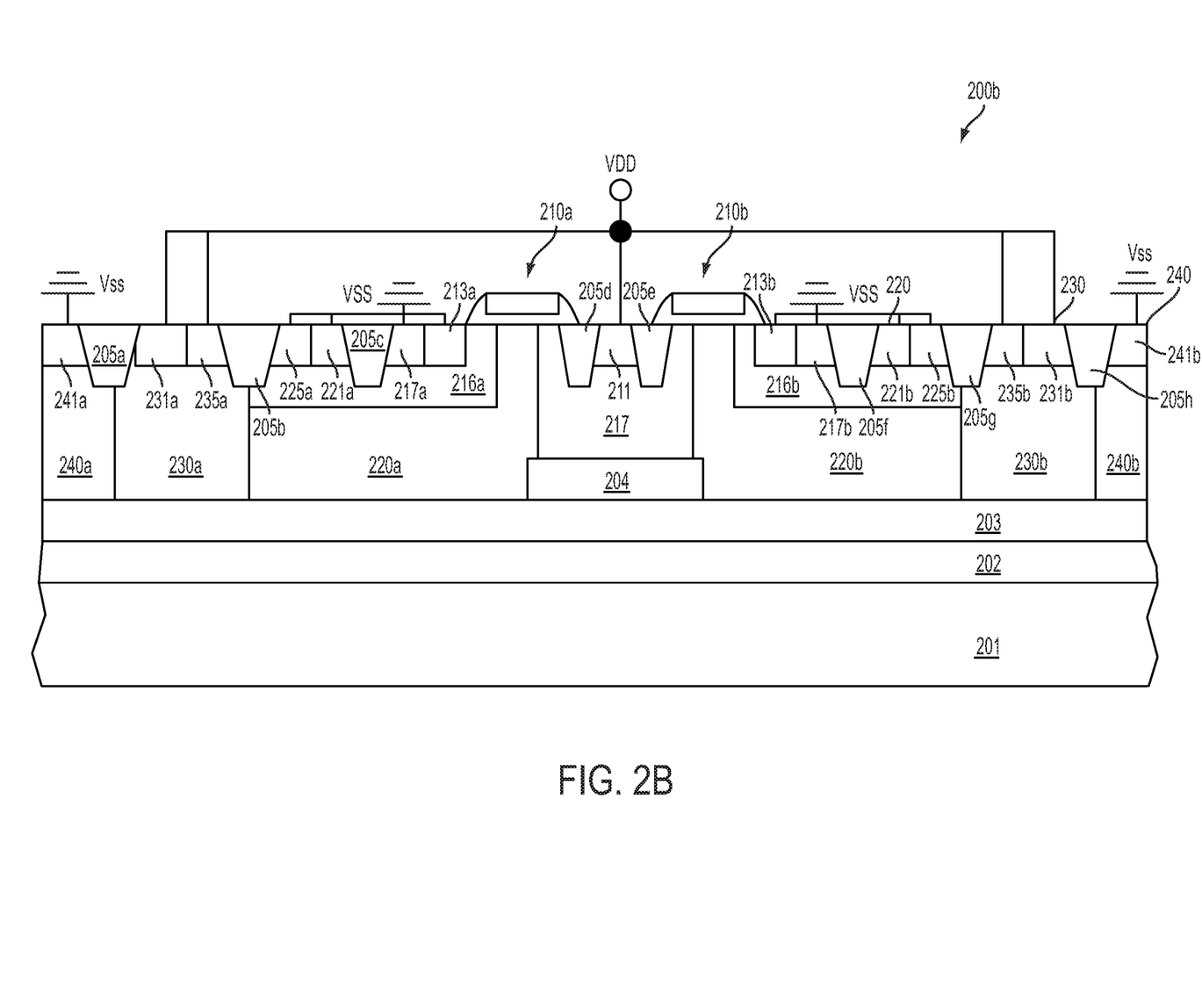
FIG. 2B is a schematic cross-sectional view of another exemplary integrated circuit including guard rings and transistors.

FIG. 2B is a schematic cross-sectional view of another exemplary integrated circuit including guard rings and transistors. Items of FIG. 2B that are the same items in FIG. 2A are indicated by the same reference numerals. In FIG. 2B, an integrated circuit 200b can include doped regions 216a and 216b, e.g., p-type doped regions. The doped regions 216a and 216b can be disposed within the p-type wells 220a and 220b, respectively. The doped regions 216a and 216b can be coupled with the n-type wells 230a and 230b, respectively. The doped regions 216a and 216b can be disposed around the sources 213a and 213b, respectively. The doped regions 216a and 216b can be operable to provide channels for the transistors 210a and 210b, respectively. In various embodiments, the doped regions 216a and 216b can be referred to as p-type body regions.

It is noted that either one of both of the SCR formed between the guard rings 220 and 230 and the SCR formed between the guard rings 230 and 240 can be operable to release the ESD. One of skill in the art can use one, two, or more SCRs to release the ESD. It is also noted that the number of the guard rings described above in conjunction with FIGS. 1, 2A, and 2B is merely exemplary. One of skill in the art can modify the number of the guard rings to achieve a desired number of the SCR. The dopant types of the guard rings, wells, layers, and/or doped regions described above in conjunction with FIGS. 1, 2A, and 2B are merely exemplary. One of skill in the art can modify or change the dopant type to achieve a desired integrated circuit having the SCR for ESD.

Figure 3:
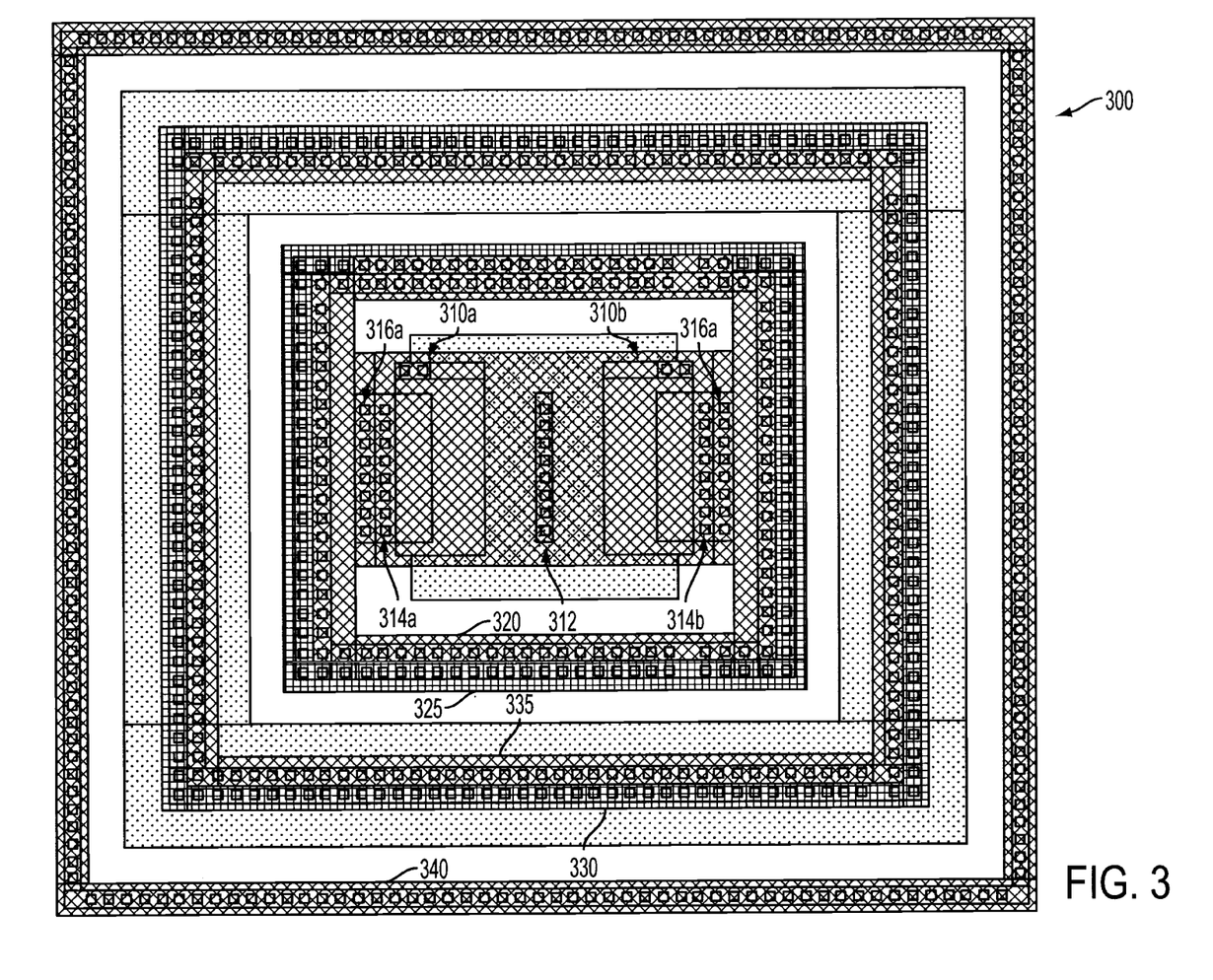
FIG. 3 is a schematic drawing illustrating a layout of an exemplary integrated circuit including guard rings disposed around transistors.

FIG. 3 is a schematic drawing illustrating a layout of an exemplary integrated circuit including guard rings disposed around transistors. Items of FIG. 3 that are the same items in FIG. 2A are indicated by the same reference numerals, increased by 100. In FIG. 3, contacts 312 can be coupled with the drains 211 (shown in FIG. 2A). Contacts 314a and 314b can be coupled with the sources 213a and 213b (shown in FIG. 2A), respectively. Contacts 316a and 316b can be coupled with the doped regions 217a and 217b (shown in FIG. 2A), respectively.

Referring to FIG. 3, a doped region 325 can be disposed adjacent to a guard ring 320. In various embodiments, the doped region 325 can be disposed around the guard ring 320. A doped region 335 can be disposed adjacent to a guard ring 330. In various embodiments, the guard ring 330 can be disposed around the doped region 335. The guard ring 320, the doped region 325, and the guard ring 330 can serve as a pnp transistor. The guard ring 330, the doped region 335, and the guard ring 320 can serve as an npn transistor. If an ESD occurs at the drains of the transistors 310a and 310b, the pnp and npn transistors can function as a SCR to release the ESD.

It is found that the doped regions 325 and 335 can be disposed adjacent to the guard rings 320 and 330, respectively. In various embodiments, the guard rings 320 and 330 can be formed and then the doped regions 325 and 335 can be formed within the guard rings 320 and 330, respectively. By taking portions of the guard rings 320 and 330, forming the doped regions 325 and 335 is substantially free from increasing the area of the integrated circuit 300. Guard ring 340 surrounds guard ring 330.

Figure 4:
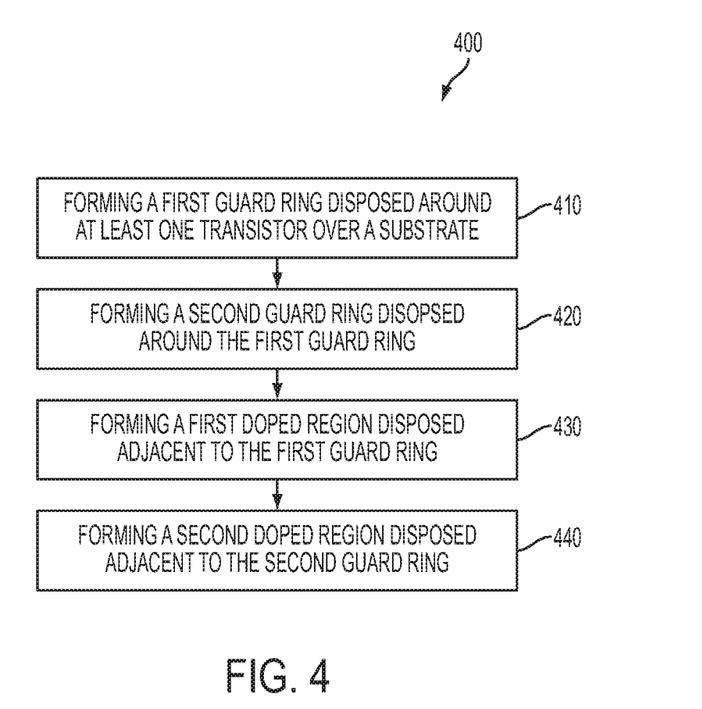
FIG. 4 is a flowchart illustrating a method for forming an exemplary integrated circuit including guard rings around transistors.

FIG. 4 is a flowchart illustrating a method for forming an exemplary integrated circuit including guard rings around transistors. In FIG. 4, a step 410 can form a first guard ring disposed around at least one transistor over a substrate. For example, the step 410 can form the guard ring 220 around the transistors 210a and 210b over the substrate 201 (shown in FIG. 2A). As noted, the guard ring 220 can include the p-type wells 220a, 220b and p+ doped regions 221a, 221b. In various embodiments, the p-type wells 220a, 220b and p+ doped regions 221a, 221b can be formed by implantation processes. In various embodiments, the transistors 210a and 210b can be formed by a process forming DMOS transistors.

Referring to FIG. 4, a step 420 can form a second guard ring around the first guard ring. For example, the step 420 can form the guard ring 230 around the guard ring 220 (shown in FIG. 2A). As noted, the guard ring 230 can include the n-type wells 230a, 230b and n+ doped regions 231a, 231b. In various embodiments, the n-type wells 230a, 230b and n+ doped regions 231a, 231b can be formed by implantation processes.

Referring to FIG. 4, a step 430 can form a first doped region disposed adjacent to the first guard ring. For example, the step 430 can form the doped regions 225a and 225b adjacent to the guard ring 220. The doped regions 225a and 225b can be formed by an implantation process. In various embodiments, the doped regions 225a, 225b and the drains 211 of the transistors 210a, 210b can be formed by the same implantation process. The process 400 can be free from adding additional step to form the doped regions 225a and 225b. In other embodiments, the doped regions 225a, 225b and the drains 211 of the transistors 210a, 210b can be formed by different implantation processes.

Referring again to FIG. 4, a step 440 can form a second doped region disposed adjacent to the second guard ring. For example, the step 440 can form the doped regions 235a and 235b adjacent to the guard ring 230. The doped regions 235a and 235b can be formed by an implantation process. In various embodiments, the doped regions 235a, 235b and the sources 213a and 213b of the transistors 210a and 210b can be formed by the same implantation process. The process 400 can be free from adding an additional step to form the doped regions 235a and 235b. In other embodiments, the doped regions 235a, 235b and the sources 213a, 213b of the transistors 210a, 210b can be formed by different implantation processes.

In various embodiments, the process 400 can include a step (not shown) forming a third guard ring around the second guard ring. For example, the step can form the guard ring 240 around the guard ring 230 (shown in FIG. 2A). As noted, the guard ring 240 can include the p-type wells 240a, 240b and p+ doped regions 241a, 241b. In various embodiments, the guard rings 220 and 240 can be formed by the same implantation process. In other embodiments, the guard rings 220 and 240 can be formed by different implantation process steps.

Figure 5:
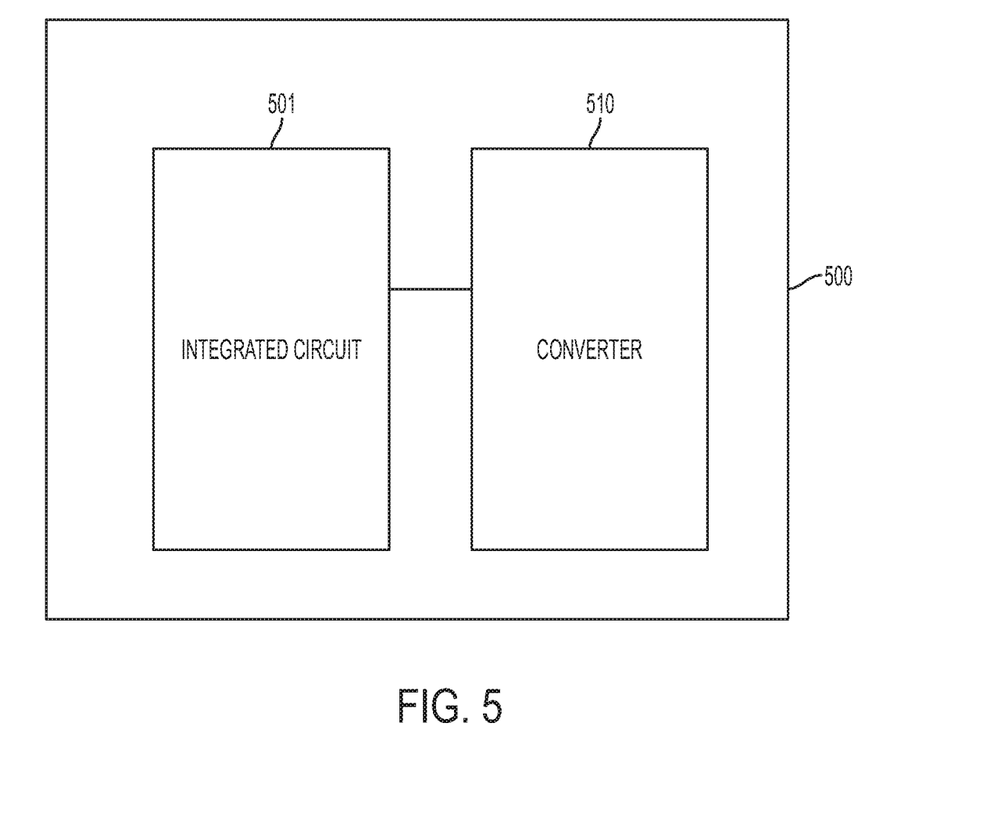
FIG. 5 is a schematic drawing showing a system including an exemplary integrated circuit coupled with a converter.

FIG. 5 is a schematic drawing showing a system including an exemplary integrated circuit coupled with a converter. In FIG. 5, a system 500 can include an integrated circuit 501 coupled with a converter 510. The converter 510 is capable of receiving an external power voltage, converting the external power voltage to the operating voltage VDD. The operating voltage VDD can be applied to the integrated circuit 501 for operations. In various embodiments, the converter 510 can be a DC-to-DC converter, an AC-to-DC converter, or other voltage converter that can provide a high operating voltage VDD, e.g., about 40 V or more. In various embodiments, the integrated circuit 501 can be similar to one of the integrated circuits 100-300 described above in conjunction with FIGS. 1-3, respectively.

In various embodiments, the integrated circuit 501 and the converter 510 can be formed within a system that can be physically and electrically coupled with a printed wiring board or printed circuit board (PCB) to form an electronic assembly. The electronic assembly can be part of an electronic system such as computers, wireless communication devices, computer-related peripherals, entertainment devices, or the like.

In various embodiments, the system 500 including the integrated circuit 501 can provide an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    implanting a first dopant to define a first guard ring, wherein the first dopant has a first conductivity type;
    implanting a second dopant to define a second guard ring, wherein the second guard ring directly contacts the first guard ring, and the second dopant has a second conductivity type;
    implanting a third dopant to define a first doped region, wherein the third dopant has the second conductivity type, and the first guard ring, the second guard ring and the first doped region form a bipolar junction transistor (BJT); and
    forming a transistor over the substrate, wherein the first guard ring surrounds the transistor.

2. The method of claim 1, further comprising forming an isolation structure between the first guard ring and the second guard ring.

3. The method of claim 2, wherein a bottom surface of the isolation structure is closer to a bottom surface of the substrate than a bottom surface of the first doped region.

4. The method of claim 1, wherein the forming of the transistor comprises forming the transistor comprising a source electrically connected to the first doped region.

5. The method of claim 1, wherein the forming of the transistor comprises forming the transistor comprising a drain electrically connected to the first doped region.

6. The method of claim 1, further comprising implanting a fourth dopant to define a second doped region.

7. The method of claim 6, wherein the implanting of the fourth dopant comprises defining the second doped region separate from the first doped region.

8. The method of claim 6, wherein the implanting of the fourth dopant comprises implanting the fourth dopant having a different conductivity type from a conductivity type of the third dopant.

9. A method of forming a semiconductor device, the method comprising:
    implanting a first dopant to define a first guard ring, wherein the first dopant has a first conductivity type;
    implanting a second dopant to define a second guard ring, wherein a first portion of the second guard ring directly contacts a first portion of the first guard ring, and the second dopant has a second conductivity type;
    implanting a third dopant to define a first doped region, wherein the third dopant has the second conductivity type;
    forming a transistor over the substrate, wherein the first guard ring surrounds the transistor; and
    forming an isolation structure, wherein the isolation structure separates a second portion of the second guard ring from a second portion of the first guard ring.

10. The method of claim 9, wherein the forming of the transistor comprises forming the transistor comprising a source electrically connected to the first doped region.

11. The method of claim 9, wherein the forming of the transistor comprises forming the transistor comprising a drain electrically connected to the first doped region.

12. The method of claim 9, further comprising implanting a fourth dopant to define a third guard ring, wherein the fourth dopant has the first conductivity type, and the third guard ring directly contacts the second guard ring.

13. The method of claim 9, further comprising implanting a fourth dopant to define a second doped region.

14. The method of claim 13, wherein the second doped region is separated from the first doped region.

* * * * *